United States Patent
Ganin et al.

(10) Patent No.: US 6,313,630 B1
(45) Date of Patent: Nov. 6, 2001

(54) MODULAR GRADIENT SYSTEM FOR MRI SYSTEM

(75) Inventors: Alexander Ganin, Whitefish Bay; Kevin F. King, New Berlin, both of WI (US)

(73) Assignee: GE Medical Systems Global Technology Company LLC, Waukesha, WI (US)

( * ) Notice: Subject to any disclaimer, the term of this patent is extended or adjusted under 35 U.S.C. 154(b) by 0 days.

(21) Appl. No.: 09/382,905

(22) Filed: Aug. 25, 1999

(51) Int. Cl.[7] .................................................. G01U 3/00
(52) U.S. Cl. ................................................................ 324/312
(58) Field of Search ...................................... 324/312, 309

(56) References Cited

U.S. PATENT DOCUMENTS

| | | | |
|---|---|---|---|
| 5,289,127 | 2/1994 | Doddrell et al. ...................... | 324/314 |
| 5,311,135 | 5/1994 | Vavrek et al. ........................ | 324/318 |
| 5,736,858 | 4/1998 | Katznelson et al. ................. | 324/318 |
| 5,742,164 | 4/1998 | Roemer et al. ...................... | 324/318 |
| 6,008,648 | * 12/1999 | Linz et al. ........................... | 324/309 |

* cited by examiner

*Primary Examiner*—Hezron Williams
*Assistant Examiner*—Dixomara Vargas
(74) *Attorney, Agent, or Firm*—Quarles & Brady, LLP; Christian G. Cabou

(57) ABSTRACT

An MRI system has two sets of gradient coils driven by two corresponding sets of gradient amplifiers. Logical gradient waveforms produced during a pulse sequence are rotated to produce corresponding physical gradient waveforms and these are distributed to drive both sets of coils simultaneously. Each distributed set of physical gradient waveforms is separately compensated for Eddy current errors, and a polarizing field Eddy current compensation signal is produced and used to modulate the RF reference frequency of the system transceiver.

13 Claims, 3 Drawing Sheets

MODULAR GRADIENT SYSTEM FOR MRI SYSTEM

BACKGROUND OF THE INVENTION

The field of the invention is nuclear magnetic resonance imaging ("MRI") methods and systems. More particularly, the invention relates to the production of magnetic field gradients in MRI systems.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. An NMR signal is emitted by the excited spins after the excitation signal $B_1$ is terminated and, this signal may be received and processed to form an image.

When utilizing NMR signals to produce images a technique is employed to obtain NMR signals from specific locations in the subject. Typically, the region which is to be imaged (region of interest) is scanned by a sequence of NMR measurement cycles which vary according to the particular localization method being used. The region of interest may be a small portion of a patient's anatomy, such as the head or heart, or a much larger portion, such as the entire thorax or spine. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective X, Y and Z axes. The magnetic field gradients are produced by a trio of coil assemblies placed around the object being imaged. By controlling the strength of these gradients during each NMR cycle, the spatial distribution of spin excitation can be controlled and the location of the resulting NMR signals can be identified.

In order to accommodate the imaging of large portions of a patient, each gradient field coil must produce a magnet field that varies linearly along one axis of a very large volume. On the other hand, to image a small portion of a patient, each gradient field coil may be smaller in physical size and have entirely different electrical characteristics than the larger whole-body gradient coils.

There are many conflicting design considerations when providing an optimal gradient subsystem for an MRI system. Factors such as peak gradient amplitude, peak gradient slew rate, gradient spatial linearity over the imaging volume, heat generation and patient safety with respect to peripheral nerve stimulation (i.e. dB/dt limits) all must be considered. Compromises must be made. For example, a very linear field gradient coil tends to be high in inductance and requires a high voltage power supply to provide a high slew rate. A coil which produces a linear gradient field over a large field of view for spinal imaging can produce excessive dB/dt when driven at a high slew rate. The efficiency (and hence heat generation) is better when a smaller gradient coil having a reduced diameter or shorter length is employed. Smaller diameter gradient coils are used, for example, when imaging the head with fast EPI pulse sequences.

A number of solutions have been proposed to address this gradient subsystem design dilemma. As described in U.S. Pat. No. 5,311,135, for example, the gradient coil windings may be tapped and the gradient amplifiers can be switched to different taps on the coils depending on the particular scan being conducted. Such switching changes the size and location of the optimal gradient fields as well as the electrical characteristics of the coils. In another solution described in U.S. Pat. No. 5,736,858, two separate sets of gradient coils are provided and the three gradient amplifiers may be switched to either or both sets depending on the particular scan being performed. One set of gradient coils is a relatively large, whole-body coil and a supplementary gradient coil set is relatively small. The gradient amplifiers have fast semiconductor switches capable of rapidly switching between three gradient coil configurations within a pulse sequence. These electronic switches add a substantial complication to the design.

SUMMARY OF THE INVENTION

The present invention is an MRI system with an improved gradient subsystem having a plurality of sets of gradient coils, each set of gradient coils having different physical and electrical characteristics that make them more desirable for particular scans. The gradient subsystem produces logical gradient waveforms which are distributed to form primary and supplementary gradient waveforms, the primary and supplementary gradient waveforms are separately compensated for Eddy current errors and the compensated primary gradient waveforms are employed to drive a primary set of gradient coils and the compensated supplementary gradient waveforms are employed to drive a supplementary set of gradient coils. The logical gradient waveforms may also be rotated to perform oblique imaging.

DESCRIPTION OF THE PREFERRED EMBODIMENT

Figure 1:
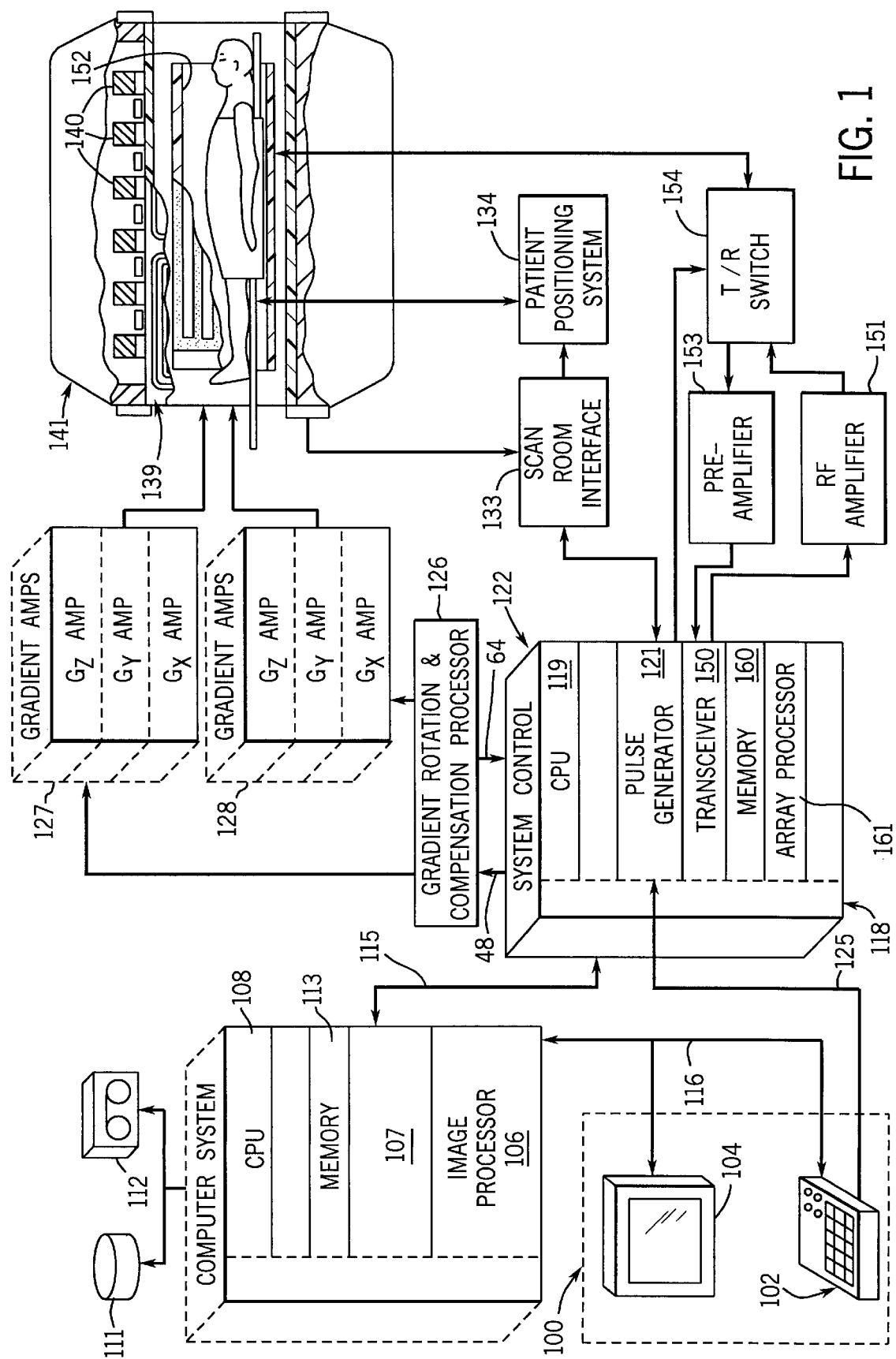
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane 118. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window.

The pulse generator module 121 also produces gradient waveforms which indicate the timing, strength and direction of the magnetic field gradients produced during the scan. These are "logical" gradient waveforms for the respective X, Y and Z axes and they are applied to a gradient rotation and compensation processor 126. As will be described in more detail below, the processor 126 rotates the logical gradient waveforms as needed to produce physical X, Y and Z gradient waveforms, and these physical gradient waveforms are compensated for eddy current errors and applied to a set of primary gradient amplifiers 127 and a set of supplementary gradient amplifiers 128.

The pulse generator module 121 also connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The two sets of gradient amplifiers 127 and 128 drive gradient coils in an assembly generally designated 139 to produce the magnetic field gradients used for position encoding acquired NMR signals. As will be described in more detail below, the gradient coil assembly 139 includes a set of primary gradient coils driven by gradient amplifiers 127 and a set of supplementary gradient coils driven by gradient amplifiers 128. The gradient coil assembly 139 forms part of a magnet assembly 141 which includes a polarizing magnet 140 and a whole-body RF coil 152.

A transceiver module 150 in the system control 122 produces pulses which are amplified by an RF amplifier 151 and coupled to the RF coil 152 by a transmit/receive switch 154. The resulting NMR signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
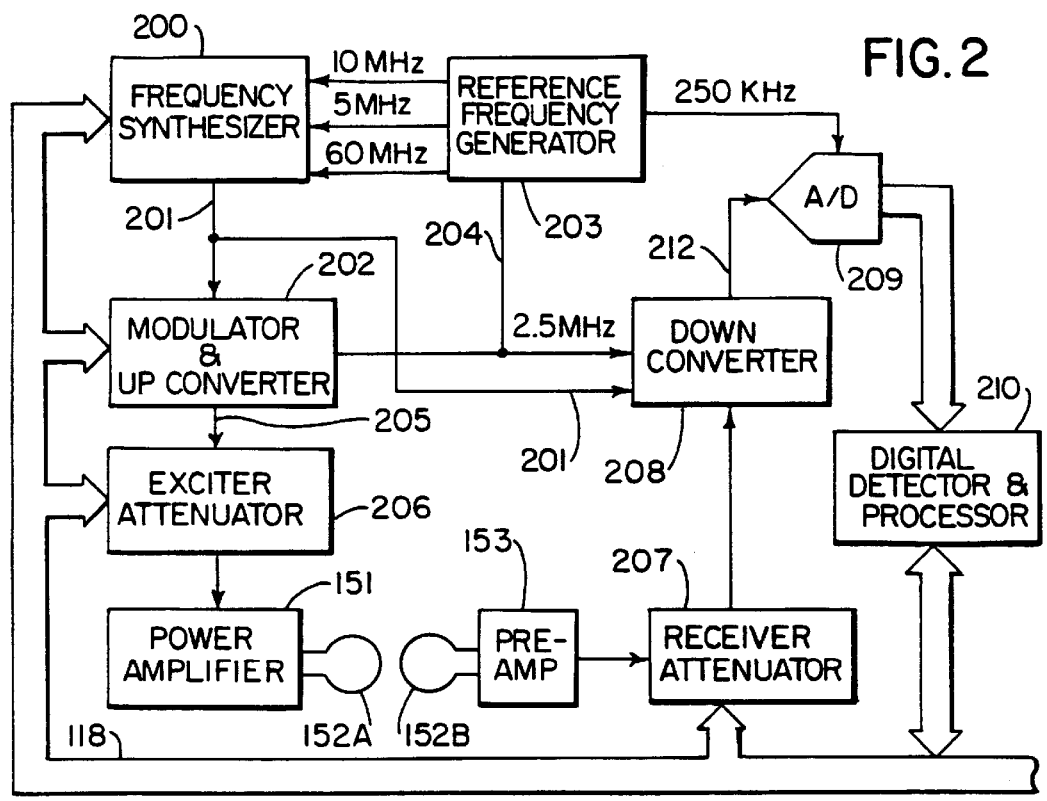
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The reference, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the NMR signal produced by the subject is picked up by the receiver coil 152B and applied through the preamplifier 153 to the input of a receiver attenuator 207. The receiver attenuator 207 further attenuates the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 Mhz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 Mhz reference signal as well as the 250 kHz sampling signal and the 5, 10 and 60 Mhz reference signals are produced by a reference frequency generator 203 from a common 20 Mhz master clock signal. For a more detailed description of the receiver, reference is made to U.S. Pat. No. 4,992,736 which is incorporated herein by reference.

Figure 3:
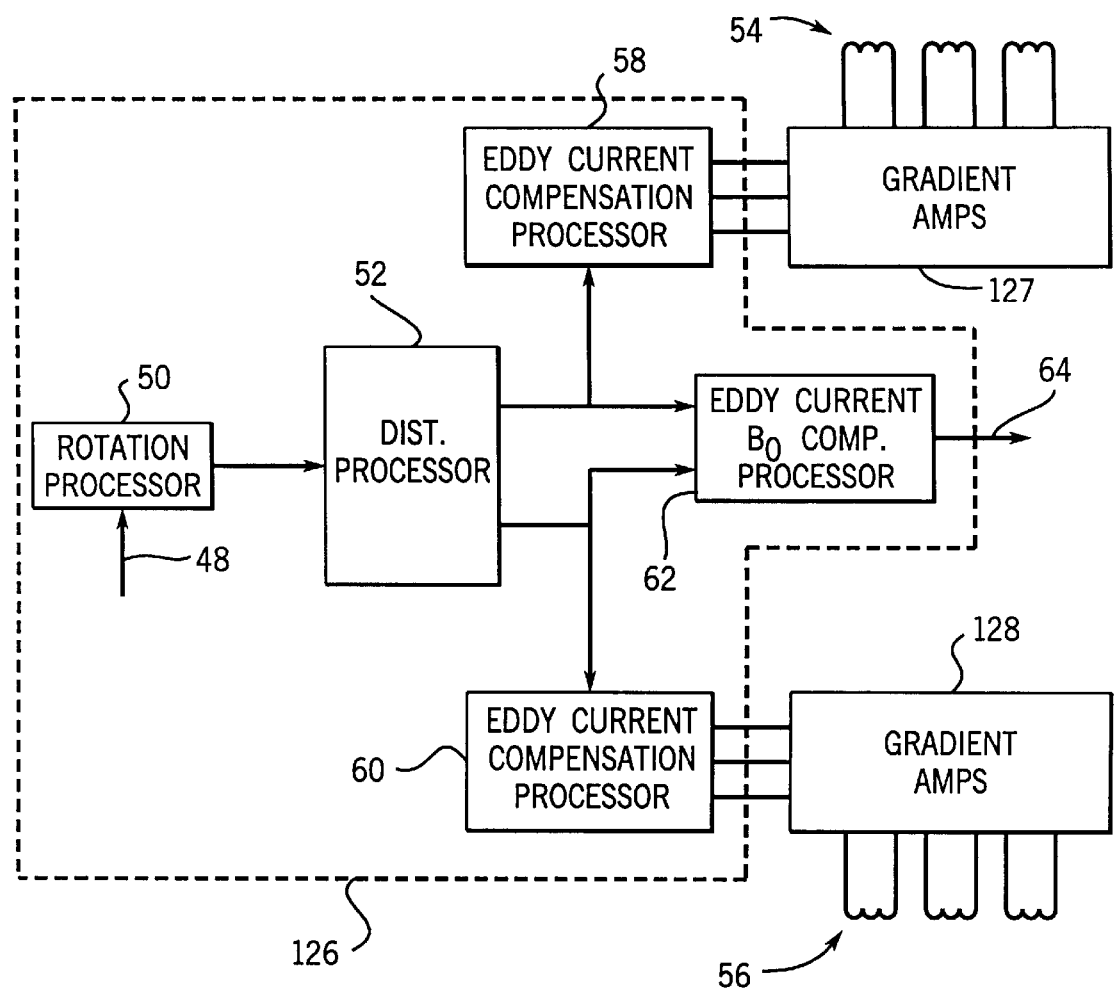
FIG. 3 is an electrical block diagram of a gradient rotation and compensation processor which forms part of the MRI system of FIG. 1.

As described above, the pulse generator 121 produces "logical" gradient waveforms that generate the slice-select, phase encoding and readout magnetic field gradients during a scan. Referring to FIG. 3, these three logical gradient waveforms are input to the process 126 at 48 and converted into X, Y and Z "physical" gradient waveforms by a rotation processor 50. As is well known in the art, this rotation is accomplished by applying the logical gradient waveforms to a rotation matrix such as that described in U.S. Pat. No.

4,743,851. Each logical gradient waveform is rotated in space to produce gradient waveform components along one, two or three of the physical gradient axes X, Y and Z. This rotation is controlled by the prescribed scan which indicates the orientation of the image slice, or slab in space.

The three physical gradient waveforms $G_x$, $G_y$ and $G_z$ are applied to a distribution processor 52 which produces corresponding physical gradient waveforms for a first set of gradient coils 54 and a second set of gradient coils 56. In the preferred embodiment the gradient coil set 54 is the primary gradient coil and the distribution processor 52 multiplies the input physical gradient waveforms by a factor ($\alpha$) which produces an optimum gradient field strength for the three primary gradient coils in the gradient coil assembly 139. The distribution processor 52 also multiplies the same input gradient waveforms by a factor (1−$\alpha$) to distribute the remaining portion of the physical gradient waveforms to the supplementary gradient coil set 56.

As is well known in the art, gradient fields produced by gradient coils located near conductive structures induce Eddy currents in those structures. The Eddy currents in turn produce their own magnetic field gradients which combine with the prescribed physical gradient waveform to distort the resulting magnetic field gradient seen by the imaged subject. Consequently, the prescribed physical gradient waveforms must be compensated to offset the errors produced by these Eddy currents. Such Eddy current compensation circuits are described for example in U.S. Pat. Nos. 4,698,591; 4,950,994; 4,978,919; 5,025,217; 5,451,877; 5,455,512 and 5,770,943. Different gradient waveforms are sent to each coil. Since different gradient waveforms produce different Eddy currents, each gradient coil is separately compensated. In the preferred embodiment a digital Eddy current compensation processor 58 is provided to compensate the physical gradient waveforms for the primary gradient coil set 54, and a digital Eddy current compensation processor 60 is provided to compensate the physical gradient waveforms for the supplementary gradient coil set 56. The compensated primary gradient waveforms are applied to gradient amplifiers 127 that produce the corresponding currents in the primary gradient coils 54. Similarly, the compensated supplementary gradient waveforms are applied to gradient amplifiers 128 that produce corresponding currents in the supplementary coils 56.

As is also well know in the art, the Eddy currents also disturb the polarizing magnetic field $B_0$. To compensate this disturbance an Eddy current $B_0$ compensation processor 62 connects to receive the distributed gradient waveforms from the processor 52. Eddy current processor 62 includes a summation circuit (not shown) which combines the $B_0$ compensation current for both coil sets 54 and 56 into a single $B_0$ compensation signal at output 64. This $B_0$ compensation signal 64 may be used to drive a shim coil (not shown) which produces a compensating $B_0$ field, but in the preferred embodiment the signal 64 is used to modify the RF carrier signal produced by the frequency synthesizer 200 (FIG. 2). Such Eddy current $B_0$ compensation processors are well known to the art as described for example, in U.S. Pat. Nos. 5,289,127 and 5,856,744.

The gradient rotation and compensation processor 126 can be operated in a number of modes to optimize the gradient subsystem for a number of different MRI applications. In a "high slew rate mode" the distribution processor 52 operates (i.e. $\alpha=0$) to apply the physical gradient waveforms only to the supplementary gradient coil set 56. These coils are designed to provide gradient fields with a high slew rate (e.g. 40 mT/m, 150 T/m/sec) over a relatively small volume (e.g. 40×40×30 cm). This mode is particularly suited for EPI, GRASE and ultra-fast MRI applications.

In a "conventional mode" of operation the distribution processor 52 operates (i.e. $\alpha=1$) to apply the physical gradient waveforms only to the primary coil set 54. These gradient coils 54 are "whole body" gradient coils that provide standard performance (e.g. gradient strength 23 mT/m and slew rate 80 T/m/sec) over a large volume (e.g. 50, 50, 50 cm) for use in spine and peripheral vascular MRI applications.

In addition, the distribution processor 52 can be operated in a "combine mode" (i.e. $0<\alpha<1$) to apply physical gradient waveforms to both gradient coil sets 54 and 56. This mode of operation produces a high gradient field strength (e.g. 63 mT/m) and a very high slew rate (e.g. 230 T/m/sec) over a small volume (e.g. 40×40×30 cm). In this combine mode a variety of different gradient field strengths and slew rates can be achieved by changing the factor $\alpha$ in the distribution processor 52.

What is claimed is:

1. In an MRI system which performs pulse sequences to acquire NMR data from a region of interest, a gradient system which comprises:

a pulse generator for producing logical gradient waveforms during the performance of a pulse sequence;

a rotation processor connected to receive the logical gradient waveforms and multiplying them by a rotation matrix to produce physical gradient waveforms;

a distribution processor connected to receive the physical gradient waveforms and produce corresponding primary gradient waveforms and corresponding supplemental gradient waveforms;

a first Eddy current compensation processor connected to receive the primary gradient waveforms and produce compensated primary gradient waveforms;

first gradient amplifiers connected to receive the compensated primary gradient waveforms and produce corresponding currents in a first set of gradient coils;

a second Eddy current compensation processor connected to receive the supplemental gradient waveforms and produce compensated supplemental gradient waveforms; and a second gradient amplifier connected to receive the compensated supplemental gradient waveforms and produce corresponding currents in a second set of gradient coils, wherein the compensated primary and supplemental gradient waveforms received respectively by the first and second gradient amplifiers can differ from one another and can occur at a variety of different levels corresponding to a variety of different modes of operation of the MRI system.

2. The gradient system as recited in claim 1 which further includes: an Eddy current $B_0$ compensation processor connected to receive the primary and supplemental gradient waveforms and produce a polarizing field compensation signal; and means connected to receive the polarizing field compensation signal for compensating the MRI system.

3. The gradient system as recited in claim 2 in which the means for compensating the MRI system includes a transceiver which employs a reference signal that is modulated in frequency by the polarizing field compensation signal.

4. The gradient system as recited in claim 1 in which the logical gradient waveforms include a readout gradient waveform, a phase encoding gradient waveform and a slice select gradient waveform.

5. The gradient system as recited in claim 4 in which the physical gradient waveforms include three orthogonal gradient waveforms disposed along respective X, Y and Z axes of the MRI system.

6. The gradient system as recited in claim 1 in which the first set of gradient coils produce magnetic field gradients in a relatively large volume that includes the region of interest, and the second set of gradient coils produce magnetic field gradients in a relatively small volume.

7. The gradient system as recited in claim 1 in which the distribution processor is operable to selectively control the relative amplitudes of the primary and supplemental gradient waveforms.

8. The gradient system as recited in claim 7 in which the distribution processor multiplies the physical gradient waveforms by a factor $\alpha$ to produce the primary gradient waveforms and the distribution processor multiplies the physical gradient waveforms by a factor $(1-\alpha)$ to produce the supplemental gradient waveforms and the value of a is from 0 to 1.

9. A method for producing magnetic field gradients in an MRI system, the steps comprising:

producing gradient waveforms;

distributing the gradient waveforms to produce corresponding primary gradient waveforms and supplemental gradient waveforms;

compensating the primary gradient waveforms for Eddy currents;

compensating the supplemental gradient waveforms for Eddy currents;

driving a primary set of gradient coils with the compensated primary gradient waveforms; and driving a supplemental set of gradient coils with the compensated supplemental gradient waveforms, wherein the compensated primary and supplemental gradient waveforms by which the primary and supplemental sets of gradient coils are respectively driven can differ from one another and can occur at a variety of different levels corresponding to a variety of different modes of operation of the MRI system.

10. The gradient system as recited in claim 9 in which the gradient waveforms are produced by:

generating logical gradient waveforms for an NMR pulse sequence; and rotating the logical gradient waveforms to physical gradient axes on the MRI system.

11. The method as recited in claim 10 in which the logical gradient waveforms are a readout gradient waveform, a phase encoding gradient waveform, and a slice select gradient waveform.

12. The gradient system as recited in claim 10 in which the physical gradient axes are three orthogonal axes on the MRI system.

13. The gradient system as recited in claim 9 which includes:

producing a polarizing magnetic field compensation signal from the primary and supplemental gradient waveforms; and adjusting an MRI system rf reference signal on the MRI system to compensate for $B_0$ Eddy current errors in the MRI system polarizing magnetic field.

* * * * *

UNITED STATES PATENT AND TRADEMARK OFFICE
CERTIFICATE OF CORRECTION

PATENT NO. : 6,313,630 B1
DATED : November 6, 2001
INVENTOR(S) : Alexander Ganin et al.

It is certified that error appears in the above-identified patent and that said Letters Patent is hereby corrected as shown below:

<u>Column 7, claim 8,</u>
Line 21, "of a is" should be -- of α is --.

Signed and Sealed this

Twenty-sixth Day of March, 2002

Attest:

Attesting Officer

JAMES E. ROGAN
*Director of the United States Patent and Trademark Office*